United States Patent
Kim

(10) Patent No.: US 7,382,469 B2
(45) Date of Patent: Jun. 3, 2008

(54) EXPOSURE APPARATUS FOR MANUFACTURING SEMICONDUCTOR DEVICE, METHOD OF EXPOSING A LAYER OF PHOTORESIST, AND METHOD OF DETECTING VIBRATIONS AND MEASURING RELATIVE POSITION OF SUBSTRATE DURING AN EXPOSURE PROCESS

(75) Inventor: Sun-bong Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 248 days.

(21) Appl. No.: 11/378,326

(22) Filed: Mar. 20, 2006

(65) Prior Publication Data

US 2006/0209307 A1    Sep. 21, 2006

(30) Foreign Application Priority Data

Mar. 21, 2005    (KR) ............... 10-2005-0023344

(51) Int. Cl.
*G01B 9/02*    (2006.01)
(52) U.S. Cl. .................. 356/500; 356/508
(58) Field of Classification Search ........ 356/500, 356/508, 509, 498; 355/52, 55, 77
See application file for complete search history.

(56) References Cited

U.S. PATENT DOCUMENTS 5,798,530 A * 8/1998 Okumura ............... 250/548
5,828,573 A * 10/1998 Hayashi ................. 700/121
6,170,622 B1 * 1/2001 Wakui et al. ............ 188/378
6,359,688 B2 * 3/2002 Akimoto et al. ......... 356/401
6,392,741 B1 * 5/2002 Mori et al. .............. 355/53

FOREIGN PATENT DOCUMENTS

| JP | 0243316 | 9/1997 |
| JP | 11325821 | 11/1999 |
| KR | 1020020067658 A | 8/2002 |

* cited by examiner

*Primary Examiner*—Hwa S Lee
(74) *Attorney, Agent, or Firm*—Volentine & Whitt, PLLC

(57) ABSTRACT

Defects are prevented from occurring during an exposure process by detecting vibration of and measuring the relative position of components of the exposure apparatus. The exposure apparatus includes an external frame on which a reference mirror is disposed, a projection lens, a first mirror fixed relative to the projection lens, a wafer stage, a second mirror fixed relative to the wafer stage, and an interferometer system that detects vibration of the projection lens using the reference mirror and the first mirror and detects the position of the wafer stage relative to the projection lens using the first and second mirrors. A second interferometer system may be provided to detect vibration of the first interferometer system.

1 Claim, 4 Drawing Sheets

EXPOSURE APPARATUS FOR MANUFACTURING SEMICONDUCTOR DEVICE, METHOD OF EXPOSING A LAYER OF PHOTORESIST, AND METHOD OF DETECTING VIBRATIONS AND MEASURING RELATIVE POSITION OF SUBSTRATE DURING AN EXPOSURE PROCESS

BACKGROUND OF THE INVENTION

1. Field of the Invention

The present invention relates to the photolithography process used in the manufacturing of semiconductor devices and the like. More particularly, the present invention relates to an exposure apparatus for exposing a layer of photoresist disposed on a substrate, and to a method of controlling the position of the substrate relative to components of the exposure apparatus during the exposure process.

2. Description of the Related Art

In general, semiconductor devices are manufactured by performing series of processes on a semiconductor substrate. These processes include a photolithography process, an ion implantation process, a deposition process, and an etching process.

Photolithography entails coating the semiconductor substrate with photoresist, exposing the photoresist to light having a predetermined wavelength and passed through a reticle, and developing the photoresist. The reticle bears a fine pattern corresponding to a pattern, e.g., a circuit pattern, to be formed on the substrate. This reticle pattern is transferred to the photoresist when the photoresist is exposed to light directed through the reticle. The developing process removes select (exposed or non-exposed) portions of the photoresist to thereby form a photoresist pattern. A fine pattern is then formed on the semiconductor substrate by etching one or more layers disposed under the photoresist pattern, i.e., by using the photoresist pattern as an etch mask. This process is repeated for several layers formed one above the other on the substrate.

The exposure apparatus for performing the exposure process includes a lens that reduces and projects an image of the pattern reticle onto the semiconductor substrate, and a device for measuring the position of the semiconductor substrate relative to the exposure apparatus so that the image of the reticle pattern can be transferred to a precise position on the layer of photoresist. The precision of the exposure process is crucial to realizing a proper alignment of the fine patterns to be formed on the layers stacked on the semiconductor substrate. Thus, the lens and the measuring device should be fixed during the exposure process while the device is measuring the relative position of the semiconductor substrate.

However, the semiconductor substrate is supported on a movable stage in the exposure apparatus, and the unit for moving the stage or external factors may induce vibrations in the lens or in the measuring device during the exposure process. If vibrations do occur, the image of the reticle pattern may not be transferred to the desired location on the semiconductor substrate. As a result, the fine patterns may not be properly aligned throughout the layers on the substrate.

SUMMARY OF THE INVENTION

An object of the present invention is to provide an exposure apparatus for use in the manufacturing of semiconductor devices and the like, which can prevent defects from being produced on a substrate due to vibration of the exposure apparatus.

Another object of the present invention is to provide a method of detecting vibration of and measuring the relative position of components of an exposure apparatus.

Still another object of the present invention is to provide a method exposing a film of photosensitive material on a substrate, wherein a desired region of the substrate can be precisely aligned with the optics of the apparatus that project the exposure light onto the substrate.

According to an aspect of the present invention, there is provided an exposure apparatus that includes a fixed reference mirror, a projection lens, a first mirror disposed on the projection lens, a substrate stage, a second mirror disposed on the substrate stage, and a first interferometer system that uses the reference mirror and the first mirror to detect vibration of the projection lens and uses the first and second mirrors to determine the position of the substrate stage relative to the projection lens.

According to another aspect of the present invention, there is provided a method of operating an exposure apparatus that includes dividing a first beam into first and second portions, directing the first portion of the first beam to a first detecting location (first detector) via a fixed reference mirror, directing the second portion of the first beam to the first detecting location (first detector) via a first mirror fixed relative to the projection lens of the exposure apparatus, dividing a second beam into first and second portions, directing the first portion of the second beam to a second detecting location (second detector) via the first mirror, and directing the second portion of the second beam to the second detecting location (second detector) via a mirror fixed relative to a substrate stage of the exposure apparatus.

A first interference pattern formed by a confluence of the first and second portions of the first beam at the first detecting location is analyzed to determine whether the projection lens is vibrating. On the other hand, a second interference pattern formed by a confluence of the first and second portions of the second beam at the second detecting location is analyzed to determine the relative position of the substrate stage.

According to still another aspect of the present invention, there is provided an exposure method that includes placing a substrate on a substrate stage, monitoring a projection lens using a first interferometer system to determine whether the projection lens is vibrating, determining the position of the substrate stage relative to the projection lens using the first interferometer system, and monitoring the first interferometer system to determine whether the first interferometer system is vibrating. If neither the projection lens nor the first interferometer system is determined to be vibrating, a projection beam is directed onto a reticle, whereby an image of the pattern of the reticle is picked up by the projection beam, and the projection beam carrying the image of the reticle pattern is focused by the projection lens onto a region of the substrate. Thus, a photosensitive film on the substrate is exposed.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE
PREFERRED EMBODIMENTS

Figure 1:
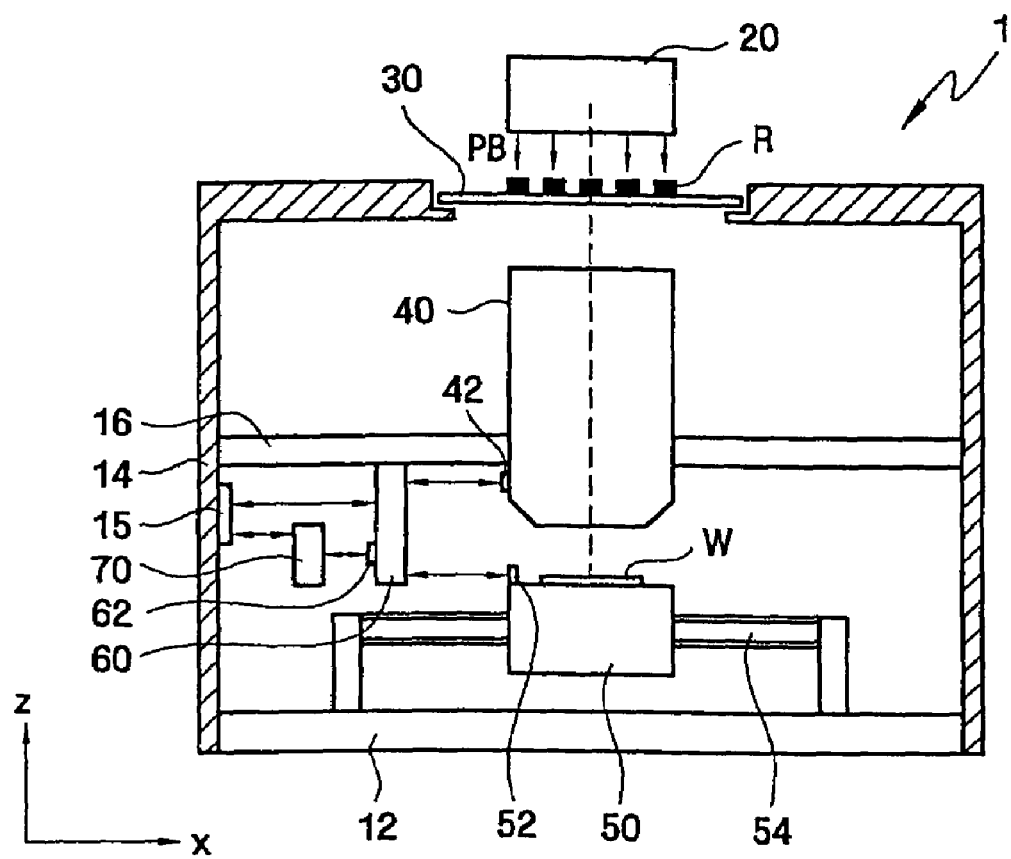
FIG. 1 is a side view, partially in section, of an exposure apparatus for fabricating a semiconductor device according to the present invention.

As shown in FIG. 1, an exposure apparatus 1 for fabricating a semiconductor device or the like includes an illuminator 20, a reticle stage 30, a projection lens 40, a wafer stage 50, a first interferometer system 60, and a second interferometer system 70.

The illuminator 20 receives light emitted from a light source (not shown) and transmits the light uniformly onto the surface of a reticle R supported by the reticle stage 30. The light source may be an ArF (193 nm) eximer laser, a KrF (248 nm) excimer laser, an $F_2$ (157 nm) laser or an $Ar_2$ (126 nm) laser. The illuminator 20 includes various elements such as an aperture, an integrator, and a condenser lens. The aperture adjusts the intensity distribution of the light emitted from the light source. The integrator receives the light from the aperture, improves the uniformity of the light, and transmits the light as a beam, referred to as a projection beam (PB), to the condenser lens. The condenser lens condenses the PB in a direction parallel to the surface of the reticle R.

The PB emerging from the illuminator 20 is incident on the surface of the reticle R supported by the reticle stage 30. Thus, the PB picks up the image of the pattern of the reticle R and propagates to the projection lens 40.

The projection lens 40 focuses the PB onto a predetermined region of a wafer W disposed on the wafer stage 50. The projection lens 40 is formed of quartz or fluorspar and has the ability to reduce the image by a magnification factor β of 1/4 or 1/5, for example. Thus, the image of the pattern of the reticle R is reduced and projected onto the wafer W.

The projection lens 40 is fixed in place and supported by a main plate 16. The main plate 16 is connected to an external frame 14 of the exposure apparatus, and the external frame 14 is set on the ground. A first mirror 42 is disposed on one side of the projection lens 40 as oriented perpendicular to an X-axis. The first mirror 42 is used in detecting vibrations of the projection lens 40 or measuring the position of the wafer stage 50 relative to the projection lens 40, as will be described in more detail later on. Although not shown, another first mirror is provided on the projection lens as oriented perpendicular to a Y-axis for use in measuring the relative position of the. wafer stage 50 along the Y-axis (the Y-axis being perpendicular to the sheet in the drawing of FIG. 1). Likewise, another first mirror may be provided on the projection lens as oriented perpendicular to the Z-axis.

The wafer stage 50 is situated below the projection lens 40, and the wafer W on which fine patterns are to be formed is seated on the wafer stage 50. The wafer stage 50 is supported by guides 54 so as to be movable along the X-axis and the Y-axis during an exposure process. The guides 54 are fixed on a base frame 12 that contacts the ground. A second mirror 52 used to measure the position of the wafer stage 50 relative to the projection lens 40 is disposed atop the wafer stage 50 as oriented perpendicular to the X-axis, i.e., with the reflecting surface thereof lying in a Y-Z plane. That is, the reflecting surfaces of the second mirror 52 and the first mirror 42 point in the same direction. Thus, a change in position of the second mirror 52 is measured based on the position of the first mirror 42 so that an X-coordinate of the wafer stage 50 can be deduced. Also, another second mirror may be disposed atop the wafer stage 50 as oriented perpendicular to the Y-axis, i.e., with the reflecting surface thereof lying in an X-Z plane. Likewise, another second mirror may be disposed atop the wafer stage 50 as oriented perpendicular to the Z-axis, i.e., with the reflecting surface thereof lying in an X-Y plane. Accordingly, Y- and Z-coordinates of the wafer stage 50 can also be deduced.

The first interferometer system 60 measures the position of the wafer stage 50 relative to the position of projection lens 40, and detects vibration that may occur in the projection lens 40 during the exposure process, so that the reticle R and the wafer W can be correctly aligned. To this end, the first interferometer system 60 has a resolving power down to the order of several nm. For the sake of brevity, the interferometer system 60 that measures the relative position of the wafer stage 50 in the direction of the X-axis, as shown in FIG. 1 will be described in detail. However, similar interferometer systems can be provided to measure the relative position of the wafer stage 50 in the direction of the Y-axis and Z-axis.

Basically, the interferometer system 60 measures the interference pattern formed by light that traverses a reference path and light that traverses a measuring path. More specifically, one side of the first interferometer system 60 faces the reflecting surfaces of the first and second mirrors 42, 52, and the other side of the first interferometer system 60 faces a reference mirror 15 disposed on the external frame 14. A third mirror 62 used in detecting vibrations that may occur in the first interferometer system 60 is disposed to the side of the first interferometer system 60 that faces the reference mirror 15.

The second interferometer system 70 is interposed between the first interferometer system 60 and the external frame 14 and more particularly, between the third mirror 62 and the reference mirror 15. The second interferometer system 70 detects vibration of the first interferometer system 60 using the interference pattern formed by light propagating along a reference path and a measuring path. Thus, the position of the wafer stage 50 can be accurately determined even when the first interferometer system 60 is vibrating.

Figure 2:
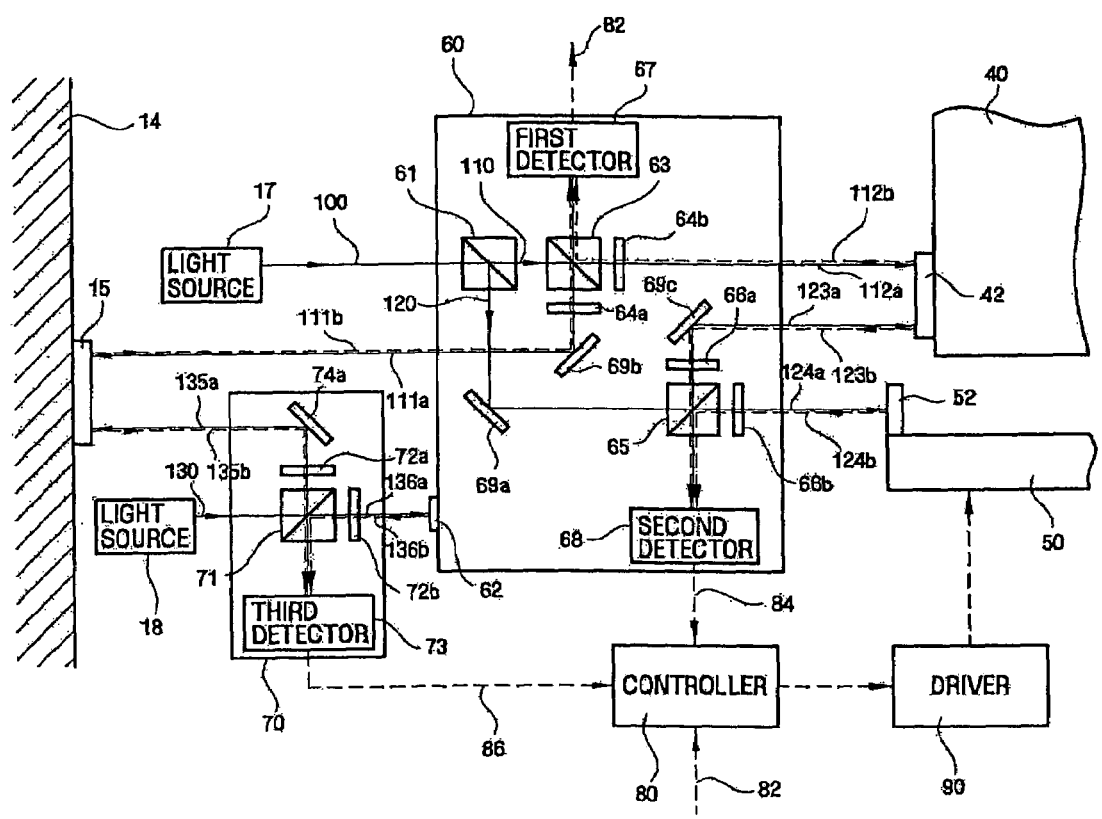
FIG. 2 is a schematic diagram of a first embodiment of a device for measuring the relative position of the substrate in the exposure apparatus shown in FIG. 1.

Referring to FIG. 2, the first interferometer system 60 includes a first polarization beam splitter 63, a first detector 67, a second polarization beam splitter 65, a second detector 68, a plurality of wavelength converters 64a, 64b, 66a, and 66b, and a plurality of mirrors 69a, 69b, and 69c. The second interferometer system 70 includes a third polarization beam splitter 71, a third detector 73, a wavelength converter 72, and a mirror 74.

The first interferometer system 60 measures an interference pattern formed by dividing a first beam 110 with the first beam splitter 63, directing one portion of the first beam 110 to the first detector 67 with the reference mirror 15 and directing the other portion of the first beam 110 to the first detector 67 with the first mirror 42. The first interferometer system 60 also measures an interference pattern formed by dividing a second beam 120 using the second beam splitter 65, directing one portion of the second beam 120 to the second detector 68 with the first mirror 42 and directing the other portion of the second beam 120 to the second detector 68 with the second mirror 52. The first beam 110 is used in detecting vibration of the projection lens 40, and the second beam 120 is used in measuring the position of the wafer stage 50 relative to the projection lens 40.

The first beam 110 and the second beam 120 are produced by a light source 17, such as a laser that emits an He—Ne laser beam 100, and a beam splitter 61 that receives the beam 100 emitted by the light source 17 and splits the beam 100 into the first beam 110 and the second beam 120. The light source 17 and beam splitter 61 may be provided as part of the first interferometer system 60. Alternatively, the light source 17 may be disposed outside of, i.e., separately from, the first interferometer system 60. Also, the beam splitter 61 can be omitted. In that case, separate light sources are provided for emitting the first beam 110 and the second beam 120, respectively.

In either case, the first beam 110 and the second beam 120 are incident on the first polarization beam splitter 63 and the second polarization beam splitter 65, respectively. The first and second beams 110 and 120 each have components that are transmitted and components that are reflected by the first polarization beam splitter 63 and the second polarization beam splitter 65, whereby each of the first and second beams 110 and 120 are divided. More specifically, the first beam 110 is spilt by the first polarization beam splitter 63 into a first incident beam 111a that is directed to the reference mirror 15 and a second incident beam 112a that is directed to the first mirror 42.

The wavelength converters 64a and 64b are disposed along the path of the first incident beam 111a and along the path of the second incident beam 112a, respectively. In addition, mirror 69b is disposed along the path of the first incident beam 111a to direct the first incident beam 111a to the reference mirror 15. The wavelength converters 64a and 64b are λ/4 plates that rotate each beam component that passes therethrough by 45°. Thus, the first incident beam 111a and the second incident beam 112a produced by the first polarization beam splitter 63 pass through the wavelength converters 64a and 64b, respectively, and are rotated by 45°.

Next, the first incident beam 111a and the second incident beam 112a are reflected from the reference mirror 15 and the first mirror 42, respectively, back to the first polarization beam splitter 63 as a first reflection beam 111b and a second reflection beam 112b. The first reflection beam 111b passes through the wavelength converter 64a while returning to the first polarization beam splitter 63 and the direction of polarization thereof is rotated 45°. Thus, the direction of polarization of the first reflection beam 111b incident on the first polarization beam splitter 63 differs by a total of 90° with respect to the direction of polarization of the first incident beam 111a. Accordingly, the first reflection beam 111b incident on the first polarization beam splitter 63 is transmitted by the first polarization beam splitter 63. On the other hand, the second reflection beam 112b, which returns to the first polarization beam splitter 63 and passes through the wavelength converter 64b, is reflected by the first polarization beam splitter 63.

Thus, the first reflection beam 111b and the second reflection beam 112b are directed to the first detector 67 by the first polarization beam splitter 63. The first reflection beam 111b propagating from the reference mirror 15 fixed to the external frame 14 is used as a reference beam, and the second reflection beam 112b propagating from the first mirror 42 disposed on the side of the projection lens 40 is used as a measuring beam. The first detector 67 converts the optical signal of the interference pattern produced by the reference and measuring beams into an electrical signal 82 and transmits the electrical signal 82 to a controller 80.

Data representing the interference pattern that would be formed by the first reflection beam 111b and the second reflection beam 112b when there is no vibration in the projection lens 40 is stored as a reference signal in the memory of the controller 80. The electrical signal 82 transmitted by the first detector 67 and the reference signal are compared in real time. Thus, the controller 80 determines that the projection lens 40 is vibrating when the signal 82 transmitted by the first detector 67 is not identical to the reference signal. In this case, a signal indicating that the projection lens 40 is vibrating is generated by the controller 80. At that time, the exposure process is stopped for a while or the problem creating the vibrations is rectified. Thus, defects otherwise caused by vibration of the projection lens 40 can be prevented.

The second polarization beam splitter 65 is optically aligned with the second mirror 52, and the second beam 120 is directed to the second polarization beam splitter 65 from the first polarization beam splitter 61. For instance, mirror 69a may be provided to reflect the second beam 120 at a right angle to the second polarization beam splitter 65. The second beam 120 is polarized in such a way that one component thereof is reflected by the second polarization beam splitter 65, and another component thereof is transmitted by the second polarization beam splitter 65. More specifically, the second polarization beam splitter 65 divides the second beam 120 into a third incident beam 123a that is directed to the first mirror 42 and a fourth incident beam 124a that is directed to the second mirror 52. In this case, mirror 69c reflects the third incident beam 123a from the second polarization beam splitter 65 to the first mirror 42.

The third incident beam 123a and the fourth incident beam 124a are reflected from the first mirror 42 and the second mirror 52, respectively, and are incident on the second polarization beam splitter 65 as a third reflection beam 123b and a fourth reflection beam 124b. Furthermore, wavelength converters 66a and 66b are disposed along the path of the third incident beam 123a and the third reflection beam 123b and along the path of the fourth incident beam 124a and the fourth reflection beam 124b, respectively. Like the wavelength converters 64a, 64b described above, the wavelength converters 66a and 66b are λ/4 plates.

Thus, the direction of polarization of the third reflection beam 123b differs by 90° with respect to the direction of polarization of the third incident beam 123a at the time the third reflection beam 123b is incident on the second polarization beam splitter 65. Thus, the third reflection beam 123b is transmitted by the second polarization beam splitter 65 to the second detector 68. The direction of polarization of the fourth reflection beam 124b differs by 90° with respect to the direction of polarization of the fourth incident beam 124a at the time the fourth reflection beam 123b is incident on the second polarization beam splitter 65. Thus, the fourth reflection beam 123b is reflected by the second polarization beam splitter 65 to the second detector 68.

Thus, the interference pattern formed by the third reflection beam 123b and the fourth reflection beam 124b is detected by the second detector 68. In this case, the second detector 68 uses the third reflection beam 123b reflected from the first mirror 42 as a reference beam and uses the fourth reflection beam 124b reflected from the second mirror 52 as a measuring beam. The second detector 68 converts the optical signal of the detected interference pattern into an electrical signal 84 and transmits the electrical signal 84 to the controller 80.

The controller 80 calculates the position of the wafer stage 50 relative to the projection lens 40 in response to the signal 84 provided by the first interferometer system 60. That is, changes in the position of the wafer stage 50 are measured based on the position of the projection lens 40.

As described above, the first interferometer system 60 may be a system of integrated components that both detect vibration of the projection lens 40 and measure the position of the wafer stage 50 using one light source 17. Alternatively, the components of the first interferometer system can be separated into discrete units that detect vibration of the projection lens 40 and measure the position of the wafer stage. 50, respectively.

Next, the second interferometer system 70 will be described in more detail. The second interferometer system 70 detects vibration of the first interferometer system 60. To this end, a third beam 130 is emitted from a light source 18 disposed outside the second interferometer system 70. However, the light source 18 may alternatively be an integral part of the second interferometer system 70. Also, the light source 18 may be a laser that emits an He—Ne laser beam like the light source 17. The third beam 130 is incident on the third polarization beam splitter 71. The third polarization beam splitter 71 is interposed between the light source 18 and the third mirror 62 and divides the third beam 130 into a fifth incident beam 135a that is to the reference mirror 15 and a sixth incident beam 136a that is directed to the third mirror 62. In this case, mirror 74a reflects the fifth incident beam 135a to the reference mirror 15 from the third polarization beam splitter 71.

The fifth incident beam 135a and the sixth incident beam 136a are reflected by the reference mirror 15 and the third mirror 62, respectively, back to the third polarization beam splitter 71 as a fifth reflection beam 135b and a sixth reflection beam 136b. The wavelength converters 72a and 72b are disposed along the path of the fifth incident beam 135a and the fifth reflection beam 135b and the path of the sixth incident beam 136a and the sixth reflection beam 136b, respectively. The wavelength converters 72a and 72b are λ/4 plates like those described above. Thus, the direction of polarization of the fifth reflection beam 135b and the direction of polarization of the sixth reflection beam 136b differ by 90° relative to the direction of polarization of the fifth incident beam 135a and the direction of polarization of the sixth incident beam 136a, respectively.

Accordingly, the fifth reflection beam 135b is transmitted by the third polarization beam splitter 71 to the third detector 73, and the sixth incident beam 136a is reflected by the third polarization beam splitter 71 to the third detector 73. The interference patterns formed by the fifth reflection beam 135b reflected from the reference mirror 15 and the sixth reflection beam 136b reflected from the third mirror 62 are detected by the third detector 73. The third detector 73 uses the fifth reflection beam 135b as a reference beam and the sixth reflection beam 136b as a measuring beam. The third detector 73 converts an optical signal of the interference pattern formed by the fifth reflection beam 135b and the sixth reflection beam 136b into an electrical signal 86 and transmits the electrical signal 86 to the controller 80.

The controller 80 analyzes the electrical signal 86 generated by the third detector 73 to detect vibrations of the first interferometer system 60. More specifically, a reference signal representative of the interference pattern that would be formed by the fifth reflection beam 135b and the sixth reflection beam 136b when the first interferometer system 60 is still is stored in the memory of the controller 80. The electrical signal 86 generated by the third detector 70 during the exposure process is compared with the reference signal in real time by the controller 80. The controller 80 determines that the first interferometer system 60 is vibrating if the electrical signal 86 and the reference signal stored in the controller 80 are not identical. In this case, the controller 80 issues a signal indicating that the first interferometer system 60 is vibrating. As a result, the exposure process is stopped for a while or the problem creating the vibrations is rectified. Accordingly, defects in which fine patterns are not formed at the desired locations on a wafer can be prevented.

As described above, the controller 80 is connected to the first detector 67, the second detector 68, and the third detector 73. The controller 80 is also connected to a driver 90 that drives the wafer stage 50. Thus, the driver 90 is controlled in response to the signals generated by the controller 80. Also, although the controller 80 of the exposure apparatus of the present invention may have a single processor 80 that receives signals from the first detector 67, the second detector 68, and the third detector 73 and outputs signals to the driver 90, the present invention is not so limited. Rather, the controller 80 may have individual processors each connected to a respective one of the detectors and the driver 90.

Figure 3:
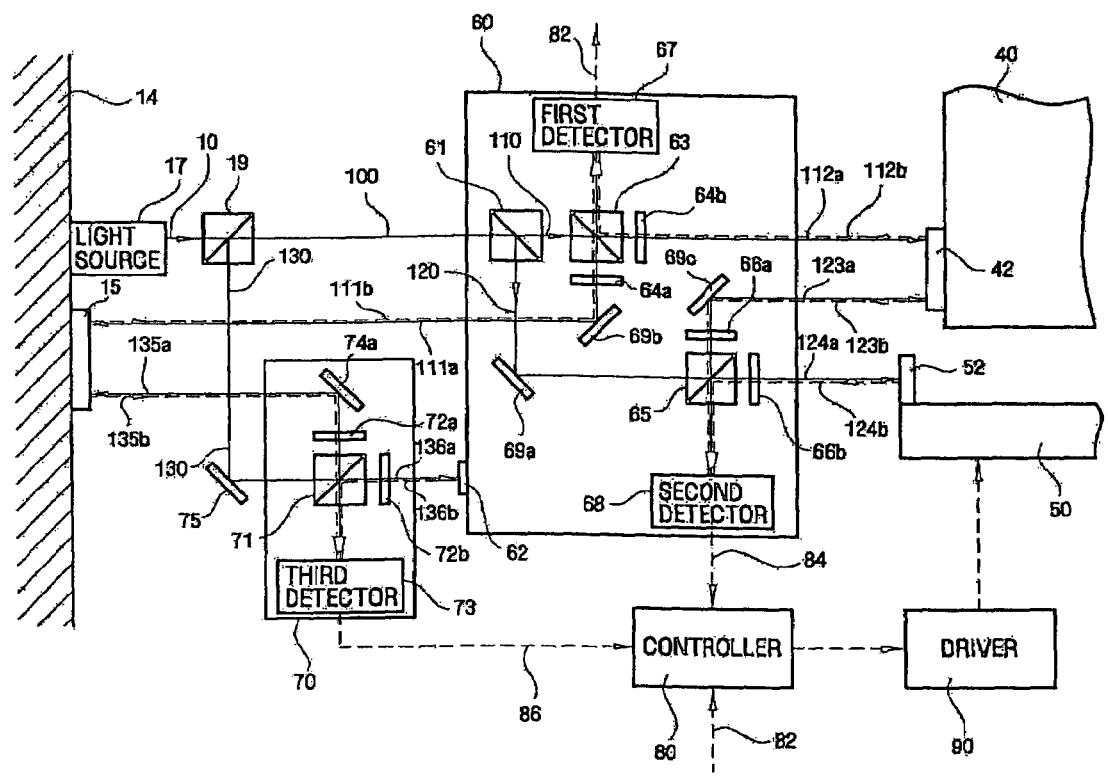
FIG. 3 is a schematic diagram of another embodiment of a device for measuring the relative position of the substrate in the exposure apparatus shown in FIG. 1.

FIG. 3 illustrates another embodiment of an exposure apparatus for use in fabricating a semiconductor device or the like according to the present invention.

As shown in FIG. 3, one common light source 17 can be used as the source of light in both the first interferometer system 60 and the second interferometer system 70. That is, a beam splitter 19 is disposed in the path of a laser beam 10 emitted from the light source 17. The laser beam 10 is divided by the beam splitter 19 into a beam 100 directed to the first interferometer system 60 and a third beam 130 directed to the second interferometer system 70.

In this case, the laser beam 100 directed to the first interferometer system 60 is again divided into a first beam 110 and a second beam 120 by a beam splitter 61. On the other hand, a mirror 75 is disposed along the path of the third beam 130 to reflect the third beam 130 onto the third polarization beam splitter 71 of the second interferometer system 70.

Otherwise, the structure and operation of the first and second interferometer systems are the same as those of the first and second interferometer systems of the embodiment of FIG. 2 described above. Thus, a further detailed description of the first and second interferometer systems will be omitted for the sake of brevity.

Figure 4:
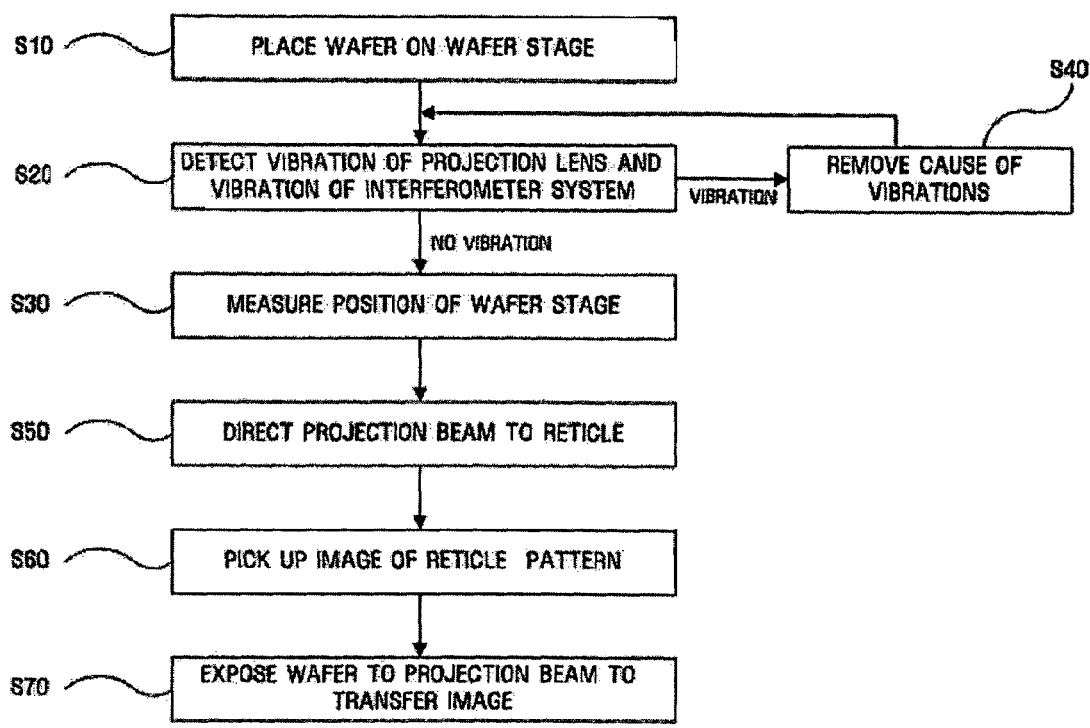
FIG. 4 is a flowchart of a method of fabricating a semiconductor device according to the present invention.

A method of fabricating a semiconductor device or the like using an exposure apparatus according to the present invention will now be described with reference to FIG. 4.

First, a substrate, such as a wafer, having a photosensitive film is placed (S10) on a wafer stage.

Next (S20), a determination is made as to whether an interferometer system and a projection lens of the exposure apparatus are vibrating. If the determination made reveals that the projection lens or the interferometer system is vibrating, the problem causing the projection lens or the interferometer system to vibrate is rectified (S40). Then, the exposure apparatus is again monitored to determine whether either the projection lens or the interferometer system is vibrating (S20).

The position of the wafer stage relative to the projection lens is measured (S30) once the determination made (S20) is that neither the projection lens nor the interferometer system are vibrating. In this case, the wafer stage is moved based on its relative position to the extent necessary to place a predetermined region of the photosensitive film in the field of exposure, i.e., to align the wafer with the projection lens, etc., of the exposure apparatus so that a pattern can be formed at a predetermined location on the surface of the wafer.

Then, a projection beam is projected onto a reticle using an illuminator (S50). As a result, a section of the projection beam picks up the image of the reticle pattern (S60). Then, the projection beam is focused onto a predetermined location on the surface of the wafer (S70). Thus, the photosensitive film is exposed, i.e., an image of the pattern of the reticle is transferred to the photosensitive film.

The operation of monitoring the projection lens and the interferometer system to determine whether either is vibrating (S20) may be continuously performed throughout the course of the exposure process as well as simply before the operation of measuring of the relative position of the wafer stage (S30).

The process is repeatedly performed until a semiconductor device having patterns exactly aligned on the wafer is fabricated.

As described above, according to the present invention, the relative position of a projection lens and a wafer stage are measured and vibration of the projection lens and vibration of an interferometer system that measures the relative position of the wafer stage and the projection lens are detected. Thus, patterns that are precisely aligned can be formed on a wafer. As a result, a highly reliable semiconductor device can be fabricated.

Finally, although the present invention has been particularly shown and described with reference to the preferred embodiments thereof, changes in form and details to the preferred embodiments will become readily apparent to those of ordinary skill in the art. For instance, the relative positions and orientations of components of the first interferometer system and the second interferometer system can vary from those described above, as they are dependent on the position of the light source(s) and the position of the first interferometer system relative to the second interferometer system. Therefore, the preferred embodiments as disclosed above may be modified without departing from the true spirit and scope of the invention as defined by the following claims.

What is claimed is:

1. An exposure method comprising:

placing a substrate on a substrate stage, the substrate having a film of photosensitive material thereon;

monitoring a projection lens using a first interferometer system to determine whether the projection lens is vibrating;

determining the position of the substrate stage relative to the projection lens using the first interferometer system;

monitoring the first interferometer system to determine whether the first interferometer system is vibrating; and if neither the projection lens nor the first interferometer system is determined to be vibrating, directing a projection beam onto a reticle bearing a pattern, whereby an image of the pattern is picked up by the projection beam, and focusing the projection beam carrying the image of the pattern of the reticle onto a region of the substrate using the projection lens.

* * * * *